US006776841B2

(12) United States Patent
Pyi

(10) Patent No.: US 6,776,841 B2
(45) Date of Patent: Aug. 17, 2004

(54) METHOD FOR FABRICATING A SEMICONDUCTOR EPITAXIAL WAFER HAVING DOPED CARBON AND A SEMICONDUCTOR EPITAXIAL WAFER

(75) Inventor: Seung Ho Pyi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/034,221

(22) Filed: Dec. 28, 2001

(65) Prior Publication Data

US 2003/0079677 A1 May 1, 2003

(30) Foreign Application Priority Data

Oct. 30, 2001 (KR) ........................................ 2001-67090

(51) Int. Cl.[7] .............................................. C30B 15/04
(52) U.S. Cl. ....................................................... 117/19
(58) Field of Search ............................ 117/13, 19, 20, 117/21

(56) References Cited

U.S. PATENT DOCUMENTS

| 5,077,143 | A | * | 12/1991 | Barraclough et al. | 428/690 |
|---|---|---|---|---|---|
| 5,360,986 | A | * | 11/1994 | Candelaria | 257/183 |
| 5,441,901 | A | * | 8/1995 | Candelaria | 437/31 |
| 5,498,578 | A | * | 3/1996 | Steele et al. | 437/235 |
| 5,561,302 | A | * | 10/1996 | Candelaria | 257/24 |
| 5,565,690 | A | * | 10/1996 | Theodore et al. | 257/18 |
| 5,961,944 | A | | 10/1999 | Aratani et al. | |
| 6,013,564 | A | | 1/2000 | Muramatsu | |
| 6,059,879 | A | | 5/2000 | Gonzalez | |
| 6,162,708 | A | | 12/2000 | Tamatsuka et al. | |
| 6,204,152 | B1 | | 3/2001 | Falster et al. | |
| 6,426,265 | B1 | * | 7/2002 | Chu et al. | 438/312 |
| 6,491,752 | B1 | * | 12/2002 | Kirscht et al. | 117/21 |
| 2002/0100917 | A1 | * | 8/2002 | Chu et al. | 257/197 |
| 2002/0121676 | A1 | * | 9/2002 | Chu et al. | 257/592 |
| 2002/0179003 | A1 | * | 12/2002 | Iida et al. | 117/19 |

FOREIGN PATENT DOCUMENTS

| JP | 1114044 | 5/1989 |
|---|---|---|
| JP | 5152179 | 6/1993 |
| JP | 7329054 | 12/1995 |
| JP | 9036080 | 2/1997 |
| JP | 9110595 | 4/1997 |
| JP | 10050639 | 2/1998 |
| JP | 10050715 | 2/1998 |
| JP | 11092300 | 4/1999 |
| JP | 11302098 | 11/1999 |
| JP | 11312683 | 11/1999 |
| JP | 077372 | 3/2000 |
| JP | 077380 | 3/2000 |
| JP | 272998 | 10/2000 |
| JP | 319099 | 11/2000 |
| JP | 2001237247 A | * 8/2001 ......... H01L/21/322 |

OTHER PUBLICATIONS

Wolf et al., Silicon Processing for the VLSI Era, vol. 1: Process Technology, Lattice Press, Sunset Beach, CA, USA, pp. 1–35, 59–61, 124–159, 1986.*

* cited by examiner

Primary Examiner—Nadine G. Norton
Assistant Examiner—Matthew A. Anderson
(74) Attorney, Agent, or Firm—Ladas & Parry

(57) ABSTRACT

A method of fabricating a semiconductor epitaxial wafer having doped carbon includes the steps of mixing a quantity of carbon with a quantity of silicon and then melting together the quantities of carbon and silicon, growing an ingot with carbon from the melted silicon containing carbon, grinding the ingot having carbon so as to produce a flat surface and a notch, slicing the ingot having carbon into a piece of silicon wafer, polishing the silicon wafer having carbon, and growing an epitaxial silicon layer on a surface of the polished silicon wafer having carbon.

13 Claims, 4 Drawing Sheets

METHOD FOR FABRICATING A SEMICONDUCTOR EPITAXIAL WAFER HAVING DOPED CARBON AND A SEMICONDUCTOR EPITAXIAL WAFER

BACKGROUND OF THE INVENTION

1. Field of the Invention

The present invention relates generally to a semiconductor epitaxial wafer and method for making the same. More particularly, the present invention relates to a method for fabricating a semiconductor epitaxial wafer in which a silicon substrate is doped with carbon by melting chunks of polysilicon and carbon together, thereby effectively controlling interstitial silicon and thereby affecting a device-active region and thus realizing a very large scale integrated semiconductor device.

2. Description of the Prior Art

In general, wafer fabrication processes necessarily require ion implantation steps. The implantation of ions into silicon crystals, however, produces a great quantity of interstitial silicons. Such interstitial silicons cause a transient enhanced diffusion of boron during subsequent heat treatment steps, and also form a deep trap level within a silicon band gap. Furthermore, transient enhanced diffusion of boron often results in a reverse short channel effect in a short channel transistor, while the deep trap level gives rise to degradation in device characteristics, such as junction leakage current.

As a solution to these problems, prior art technology has used a proximate gettering methods in which carbon is implanted into a channel region to absorb the interstitial silicons. Although proximate gettering methods can advantageously suppress the transient enhanced diffusion of boron by implanted carbon, unfortunately, the carbon atoms may form another trap level causing an increase in junction leakage current.

SUMMARY OF THE INVENTION

It is therefore an object of the present invention to provide a method for fabricating semiconductor epitaxial wafers that are capable of suppressing an increase in junction leakage current due to a trap level formed by doped carbon.

Another object of the present invention is to provide a method for fabricating a semiconductor epitaxial wafers that are capable of improving an intrinsic gettering effect by forming many more intrinsic gettering regions.

These and other objects are attained in accordance with the present invention by a method for fabricating a semiconductor epitaxial wafer having doped carbon, the method comprising the steps of providing silicon containing carbon, growing an ingot from the silicon containing carbon, forming a silicon wafer with carbon by slicing the ingot and then surface-treating the sliced ingot, and growing an epitaxial silicon layer on a surface of the silicon wafer with carbon.

According to another aspect of the present invention, a method for fabricating a semiconductor epitaxial wafer having doped carbon, the method comprising the steps of mixing a quantity of carbon with a quantity of silicon and then melting together the quantities of carbon and silicon, growing an ingot from the melted silicon containing carbon, grinding the ingot so as to produce a flat surface and a notch, slicing the ingot into a piece of a silicon wafer having carbon, polishing the silicon wafer having carbon, and growing an epitaxial silicon layer on a surface of the polished silicon wafer having carbon, is provided.

According to another aspect of the present invention, a semiconductor epitaxial wafer, comprises a quantity of carbon contained within a quantity of silicon; an ingot formed from the silicon containing carbon; a silicon wafer having carbon obtained by slicing the ingot to obtain a plurality of rough wafers; and an epitaxial silicon layer formed on a surface of each silicon wafer having carbon.

DETAILED DESCRIPTION OF THE INVENTION

The present invention will be now described more fully hereinafter with reference to the accompanying drawings, in which the steps of preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
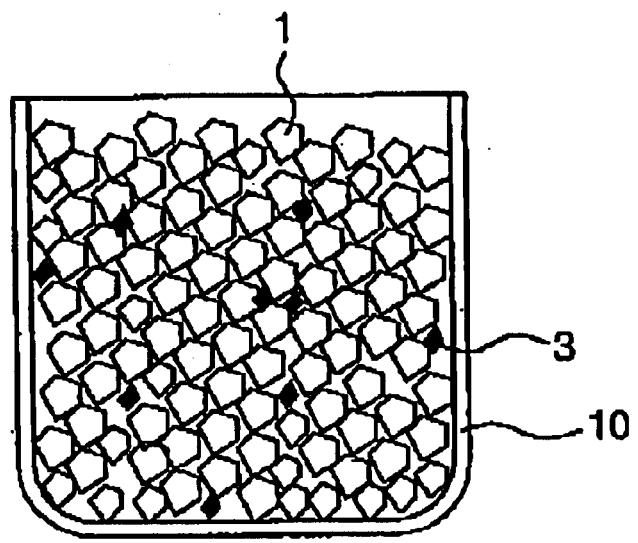
FIG. 1 is a schematic view showing quantities of polysilicon and carbon together in a crucible to be used in the method steps for fabricating a semiconductor epitaxial wafer according to an embodiment of the present invention.
Figure 2:
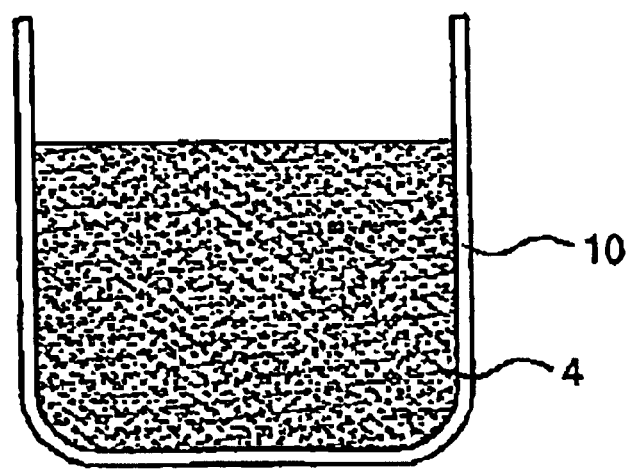
FIG. 2 is a schematic view of the polysilicon and carbon melted in the crucible in the method for fabricating a semiconductor epitaxial wafer according to an embodiment of the present invention.

As shown in FIG. 1, a quantity of crystalline silicon 1 is contained in a crucible 10 in preparation of forming a silicon wafer. In addition, a quantity of carbon pieces 3 is mixed in with the crystalline silicon 1 in the crucible 10. The mixed quantities silicon 1 and carbon 3 are then heated until the mixture reaches a liquid silicon state 4, as shown in FIG. 2. Preferably, the doping concentration of carbon in the molten silicon 4 is about $1 \times 10^{14}$ to $5 \times 10^{17}$ atoms/cm$^3$.

Figure 3:
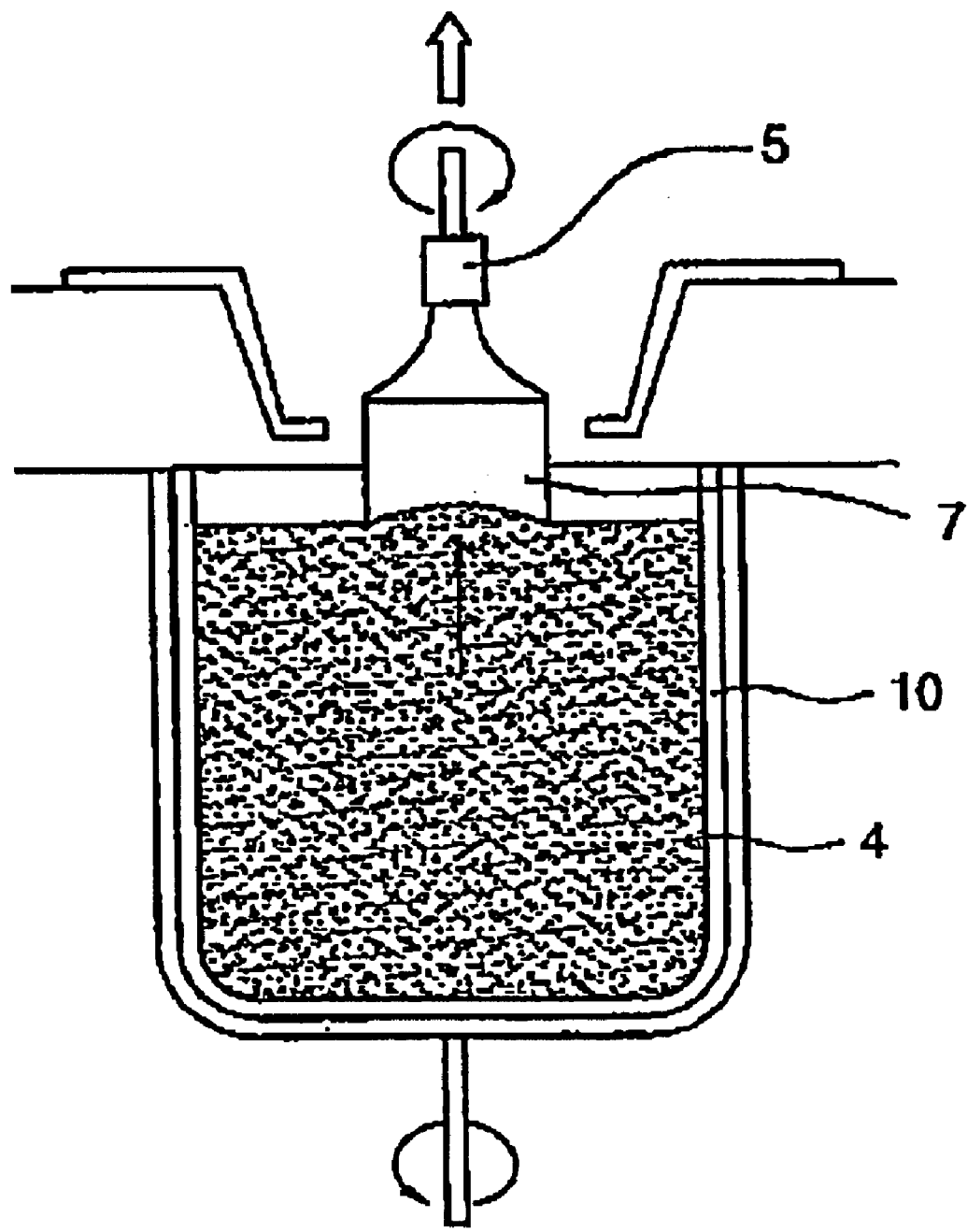
FIG. 3 is a schematic view of a silicon ingot having doped carbon being grown by using the Czochralski method in the steps of the method for fabricating a semiconductor epitaxial wafer according to an embodiment of the present invention.

Thereafter, referring to FIG. 3, a seed crystal 5 of the required orientation is touched to the upper surface of the molten silicon 4 and then slowly raised upwardly while the seed crystal 5 and the crucible 10 are rotated in opposite directions. A silicon ingot 7 having doped carbon therein is therefore grown to a single crystal structure. Such a crystal growing method is well known, and has been referred to as the Czochralski method. Alternatively, another crystal growing method, such as the Floating Zone method, may be used. Preferably, the oxygen concentration in the ingot 7 is controlled to a level between 8 and 13 parts per million atoms (ppma).

Figure 4:
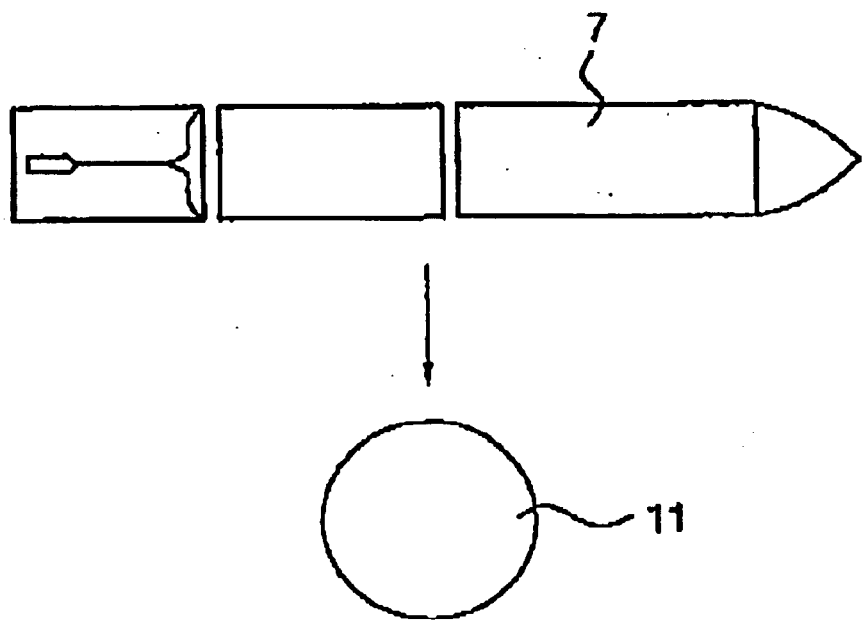
FIG. 4 is a schematic view showing being sliced into a piece of a primitive wafer having doped carbon in the method for fabricating a semiconductor epitaxial wafer according to an embodiment of the present invention.

Subsequently, the silicon ingot 7 having doped carbon and grown in accordance with the specific orientation is subjected to a grinding process in order to produce a flat surface and a notch, and then fastened to a carbon beam by using epoxy. Next, as schematically depicted in FIG. 4, the silicon ingot 7 is sliced into a plurality of pieces, comprising primitive wafers 11 having doped carbon. Then the primitive wafers 11 may be further subjected to an edge grinding process.

Figure 5:
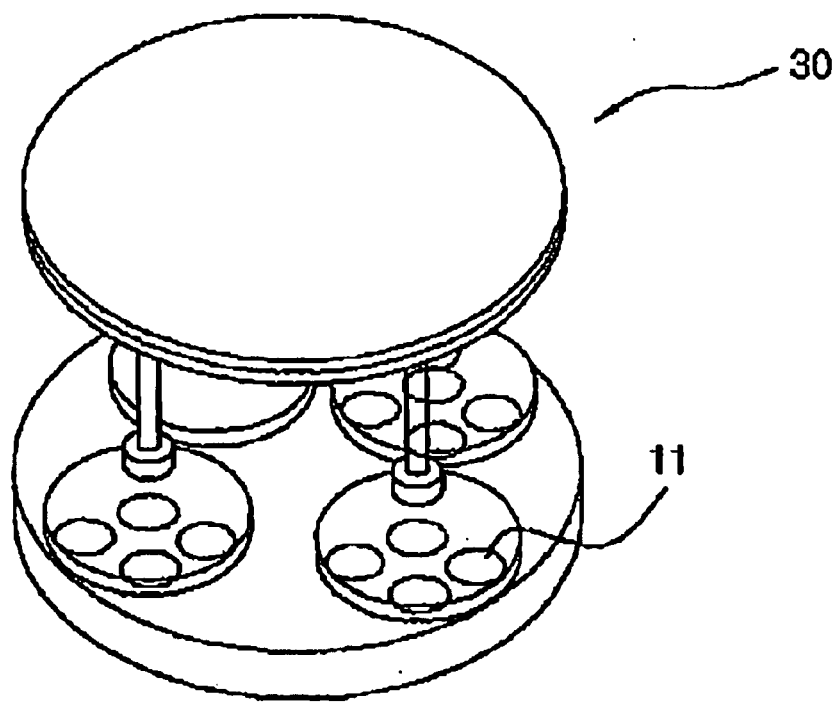
FIG. 5 is a schematic view showing the steps of polishing the sliced wafer having doped carbon in a method for fabricating a semiconductor epitaxial wafer according to an embodiment of the present invention.

Thereafter, referring to FIG. 5, the sliced wafers 11 having doped carbon undergo a surface polishing process by using a polishing apparatus 30. In addition, other conventional processes such as rough polishing, edge polishing, etching in an acid or alkali solution, thermal doner killing, and fine polishing may be further performed before or after the surface polishing process.

Figure 6:
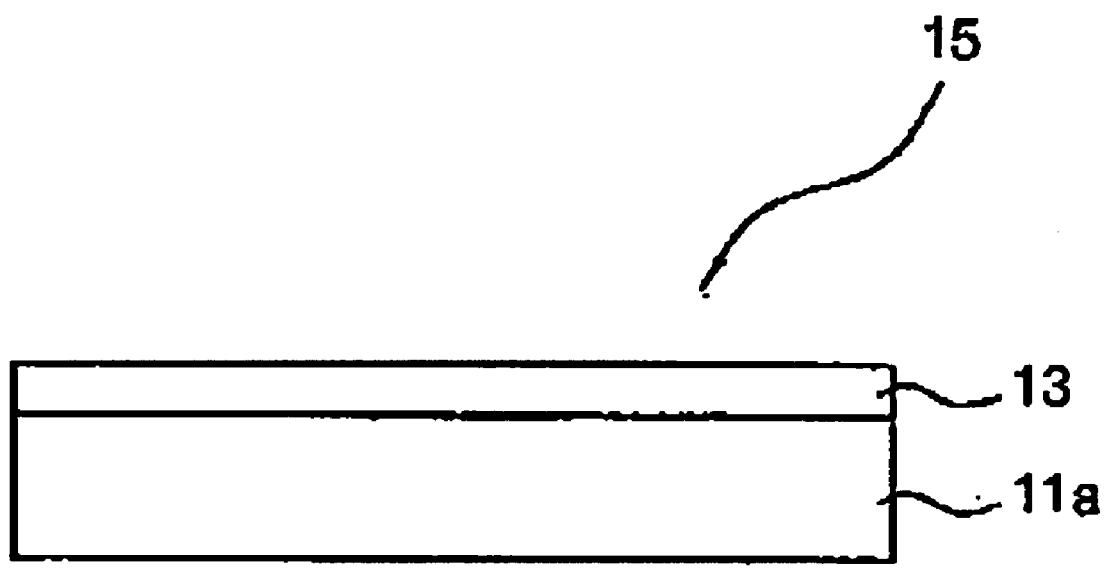
FIG. 6 is an elevational side view showing the step of growing an epitaxial layer on the polished wafer having doped carbon in a method for fabricating a semiconductor epitaxial wafer according to an embodiment of the present invention.

Next, the polished wafers, one polished 11 having doped carbon shown in FIG. 6, is supplied to an appropriate chamber (not shown) for epitaxial silicon growth. Referring to FIG. 6, in the chamber, an epitaxial silicon layer 13 is grown to a predetermined thickness on the polished wafer 11, so that a semiconductor epitaxial wafer 15 having doped carbon is obtained. Preferably, the thickness of the epitaxial silicon layer 13 is controlled to a value between 0.5 and 5 microns.

As fully described hereinbefore, the fabrication method according to the present invention has advantages as follows. Since the epitaxial silicon layer on the silicon wafer doped with carbon forms a device active region in subsequent fabrication steps (not further described herein), interstitial silicon in a certain depth is combined with carbon. Accordingly, the concentration of silicon infiltrated into the device active region can be considerably decreased. That is, the present invention provides an effect according to carbon doping in addition to an existing advantage according to the use of the epitaxial silicon wafer. In particular, since the silicon wafer having doped carbon has many more intrinsic gettering regions than other silicon wafers having no doped carbon, the intrinsic gettering effect is also improved.

In the drawings and specification, there have been disclosed typical preferred embodiments of the invention and, although specific terms are employed, they are used in a generic and descriptive sense only and not for purposes of limitation, the scope of the invention being set forth in, and only being limited by, the following claims.

What is claimed is:

1. A method for fabricating a semiconductor epitaxial wafer having a silicon wafer doped with carbon, comprising the steps of:
   providing the silicon wafer doped with carbon by the steps comprising:
   heating a quantity of carbon and another quantity of silicon;
   growing an ingot from the molten silicon and carbon, wherein the density of carbon in the ingot is greater than 5 parts per million atom (ppma):
   forming the silicon substrate doped with carbon by slicing the ingot to obtain a plurality of primitive wafers having doped carbon and then surface-treating the sliced primitive wafers doped with carbon; and
   growing an epitaxial silicon layer on a surface of each silicon substrate doped with carbon.

2. The method a claim 1, wherein a concentration of carbon contained in the silicon is between $1\times10^{14}$ and $5\times10^{17}$ atoms/cm$^3$.

3. The method of claim 1, wherein the concentration of oxygen in the silicon wafer having carbon is between 8 and 13 parts per million atoms (ppma).

4. The method of claim 1, wherein the epitaxial silicon layer of the wafer has a thickness of between 0.5 and 5 microns.

5. The method of claim 1, wherein the epitaxial silicon layer is used as a device active region.

6. The method of claim 1, wherein a further step comprises mixing the carbon with the quantity of silicon and then melting the carbon together with the silicon.

7. A method for fabricating a semiconductor epitaxial wafer having a silicon wafer having carbon, comprising the steps of:
   mixing a quantity of carbon with a quantity of silicon and then melting together the quantities of carbon silicon;
   growing an ingot from the molten silicon and carbon wherein the density of carbon in the ingot is grater than 5 parts per million atoms (ppma):
   grinding the ingot having carbon so as to produce a flat surface and a notch;
   slicing the ingot having carbon into a piece of silicon wafers;
   polishing the piece of silicon wafer having carbon; and
   growing an epitaxial silicon layer on a surface of the polished silicon wafer having carbon.

8. The method of claim 7, wherein a concentration of carbon contained in the melted silicon is between $1\times10^{14}$ and $5\times10^{17}$ atoms/cm$^3$.

9. The method of claim 7, wherein the concentration of oxygen in the silicon wafer having carbon in between 8 and 13 parts per million atoms (ppma).

10. The method of claim 7, wherein the epitaxial silicon layer is formed to a thickness of between 0.5 and 5 microns.

11. The method of claim 7, wherein the epitaxial silicon layer is used as a device active region.

12. The method of claim 7, wherein the step of growing of the ingot having carbon is performed by a Czochralski method or a Floating Zone method.

13. The method of claim 7, wherein the polishing of the silicon wafer having carbon includes one process selected from the group of processes consisting of surface polishing, rough polishing, edge polishing, etching in an acid or alkali solution, thermal doner killing, and fine polishing.

\* \* \* \* \*